United States Patent
Kitch

(10) Patent No.: US 6,602,755 B1
(45) Date of Patent: Aug. 5, 2003

(54) METHOD FOR MANUFACTURING A COMPACT BIPOLAR TRANSISTOR STRUCTURE

(75) Inventor: Vassili Kitch, San Ramon, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/266,729

(22) Filed: Oct. 8, 2002

Related U.S. Application Data

(62) Division of application No. 09/644,773, filed on Aug. 23, 2000, now Pat. No. 6,495,904.

(51) Int. Cl.⁷ ............................................. H01L 21/331
(52) U.S. Cl. ...................... 438/309; 438/322; 438/331; 438/202
(58) Field of Search ................................ 438/702, 202, 438/203, 309, 313, 322, 331

(56) References Cited

U.S. PATENT DOCUMENTS

| | | |
|---|---|---|
| 5,045,483 A | 9/1991 | DeLong et al. |
| 5,288,652 A | 2/1994 | Wang et al. |
| 5,436,496 A | 7/1995 | Jerome et al. ............... 257/529 |
| 5,659,197 A | 8/1997 | Wei ............................ 257/588 |

*Primary Examiner*—David Nelms
*Assistant Examiner*—Thao Le
(74) *Attorney, Agent, or Firm*—Stallman & Pollock LLP

(57) ABSTRACT

A bipolar transistor structure that includes a semiconductor material substrate that has a bottom substrate and base region of a first conductivity type and a buried layer, collector region and sink region of a second conductivity type. The substrate has an extrinsic base region of the first conductivity type and an emitter region of the second conductivity type, both of which extend from the substrate's upper surface into the base region. The bipolar transistor structure also includes a single patterned polysilicon layer with a first polysilicon portion of the first conductivity type in contact with the extrinsic base region and a second polysilicon portion of the second conductivity type in contact with the emitter region. The bipolar transistor structure is compact since contact to the extrinsic base region is made by the first polysilicon portion, which can be formed to a minimum dimension and self-aligned to the extrinsic base region. The extrinsic base and base regions can, therefore, be small, providing a low extrinsic base resistance, low base resistance and low collector-base capacitance. A process for forming such a bipolar transistor structure includes depositing a polysilicon layer and then implanting dopant ions of the first and second conductivity types into the polysilicon layer using first and second patterned mask layers, respectively. After etching the polysilicon layer, a thermal treatment creates an extrinsic base region and an emitter region by diffusing ions from the etched polysilicon layer. The process is inexpensive since it employs only a single patterned polysilicon layer.

6 Claims, 6 Drawing Sheets

METHOD FOR MANUFACTURING A COMPACT BIPOLAR TRANSISTOR STRUCTURE

The present application is a division of U.S. patent application Ser. No. 09/644,773, filed Aug. 23, 2000 U.S. Pat. No. 6,495,904.

BACKGROUND OF THE INVENTION

1. Field of the Invention

The present invention relates to semiconductor device structures and, in particular, to bipolar transistor structures and methods for their manufacture.

2. Description of the Related Art

FIG. 1 illustrates a conventional single polysilicon bipolar transistor structure 10. Conventional single polysilicon bipolar transistor structure 10 includes a P-type bottom substrate 12, an N-type buried layer 14, and N-type collector region 16, an N-type sink region 18 and a P-type base region 20. The conventional single polysilicon bipolar transistor structure 10 also includes a P-type extrinsic base region 22, and an N-type emitter region 24, both disposed within the P-type base region 20. In addition, the conventional single polysilicon bipolar transistor structure 10 includes shallow trench isolation region 26, field silicon dioxide regions 28, and patterned silicon dioxide ($SiO_2$) layer 30.

In conventional single polysilicon bipolar transistor structure 10, a single N-type patterned polysilicon layer 32 makes contact with the N-type emitter region 24. Furthermnore, base contact 34 is in direct contact with the P-type extrinsic base region 22, emitter contact 36 is in contact with the N-type patterned polysilicon layer 32, and collector contact 38 is in direct contact with the N-type sink region 18. The base contact 34, emitter contact 36 and collector contact 38 each extend through dielectric layer 40.

In order to provide for the base contact 34 to be consistently manufactured in direct contact with the P-type extrinsic base region 22 using standard semiconductor device manufacturing techniques, the P-type extrinsic base region 22 must be relatively large. For example, a base contact with a diameter (i.e., width) of 0.5 microns can require an extrinsic base region that is 1.1 microns wide in order to provide a sufficient alignment tolerance for standard semiconductor device manufacturing techniques.

FIG. 2 illustrates a conventional double polysilicon bipolar transistor structure 50. Conventional double polysilicon bipolar transistor structure 50 includes a P-type bottom substrate 52, an N-type buried layer 54, and N-type collector region 56, an N-type sink region 58 and a P-type base region 60. The conventional double polysilicon bipolar transistor structure 50 also includes a P-type extrinsic base region 62, and an N-type emitter region 64, both disposed within the P-type base region 60. In addition, the conventional double polysilicon bipolar transistor structure 50 includes shallow trench isolation region 65, field silicon dioxide regions 66, and patterned silicon dioxide ($SiO_2$) layer 68.

In conventional double polysilicon bipolar transistor structure 50, a P-type patterned polysilicon layer (a "poly 1 layer") 70 makes contact with the P-type extrinsic base region 62 and an N-type patterned polysilicon layer (a "poly 2 layer") 72 makes contact with the N-type emitter region 64. Furthermore, base contact 74 is in contact with the poly 1 layer 70, emitter contact 76 is in contact with the poly 2 layer 72, and collector contact 78 is in direct contact with the N-type sink region 58. The base contact 74, emitter contact 76 and collector contact 78 each extend through dielectric layer 80.

Further descriptions of bipolar transistor structures are available in S. Wolf, *Silicon Processing for the VLSI Era*, Volume 2-*Process Integration*, 500–523 (Lattice Press, 1990), which is hereby fully incorporated by reference.

There are drawbacks associated with the aforementioned conventional bipolar transistor structures of FIGS. 1 and 2. First, the relatively large size of the P-type extrinsic base region 22 of conventional single polysilicon bipolar transistor structure 10 necessitates a relatively large base region 20 and, therefore, a relatively large bipolar transistor structure. Second, the relatively large P-type extrinsic base region 22 and P-type base region 20 produce a relatively high extrinsic base region resistance ($R_{B1}$), a relatively high base region resistance ($R_{B2}$) and a relatively high collector-base capacitance ($C_{CB}$). These high resistances and high collector-base capacitance degrade the performance (e.g., speed) of any bipolar transistor devices that include a conventional single polysilicon bipolar transistor structure. The conventional double polysilicon bipolar transistor structure 50, although providing a relatively small P-type extrinsic base region 62, includes two separate patterned polysilicon layers (i.e., the poly 1 layer and the poly 2 layer). The manufacturing of a double polysilicon bipolar transistor structure is, therefore, relatively expensive since it involves the deposition and patterning of two separate polysilicon layers.

Still needed in the field, therefore, is a bipolar transistor structure that is small in size (i.e., compact) and that has a low extrinsic base region resistance, a low base region resistance and a low collector-base capacitance. Also needed is a process for manufacturing such a bipolar transistor structure that is inexpensive and compatible with standard semiconductor device manufacturing techniques.

SUMMARY OF THE INVENTION

The present invention provides a bipolar transistor structure that is compact and has a low extrinsic base region resistance, a low base region resistance and a low collector-base capacitance. Bipolar transistor structures according to the present invention include a semiconductor material substrate that has a bottom substrate of a first conductivity type. The semiconductor material substrate also includes a buried layer, a collector region and a sink region, each of a second conductivity type, and a base region of the first conductivity type. The buried layer overlies the bottom substrate, while the collector region overlies the buried layer. The sink region extends from the upper surface of the semiconductor material substrate to the buried layer and is adjacent to the collector region. The base region is disposed overlying the collector region and spaced apart from the sink region.

The semiconductor material substrate also has an extrinsic base region and an emitter region. The extrinsic base region is of the first conductivity type and extends from the upper surface of the semiconductor material substrate into the base region. The emitter region is of the second conductivity type, is spaced apart from the extrinsic base region, and extends from the upper surface of the semiconductor material substrate into the base region. The bipolar transistor structure also includes a single patterned polysilicon layer that at least partially overlies the semiconductor material substrate. The single patterned polysilicon layer includes a first polysilicon portion of the first conductivity type in contact with the extrinsic base region, and a second polysilicon portion of the second conductivity type in contact with the emitter region.

Bipolar transistor structures according to the present invention are compact in size since direct contact to the extrinsic base region is made by the first polysilicon portion, which can be formed to a minimum dimension and self-aligned to the extrinsic base region. Since contact to the extrinsic base region is made by a first polysilicon portion that can be formed to a minimum dimension, the extrinsic base region and base region can also be of a small size, thereby providing a low extrinsic base resistance ($R_{B1}$), a low base resistance ($R_{B2}$) and a low collector-base capacitance ($C_{CB}$).

Also provided is a process for forming a bipolar transistor structure that is inexpensive and compatible with standard semiconductor device manufacturing techniques. The process includes providing a semiconductor material substrate having a bottom substrate and base region of a first conductivity type, as well as a buried layer, collector region and sink region of a second conductivity type. In the semiconductor material substrate, the buried layer overlies the bottom substrate, while the collector region overlies the buried layer. The sink region extends from the upper surface of the semiconductor material substrate to the buried layer and is adjacent to the collector region. In addition, the base region overlies the collector region and is spaced apart from the sink region.

Next, a polysilicon layer is deposited that at least partially overlies the upper surface of the semiconductor material substrate. A first patterned mask layer (e.g., a first patterned photoresist mask) is then formed on the polysilicon layer and dopant ions of the first conductivity type are subsequently implanted into the polysilicon layer using the first patterned mask layer as an implantation mask. The first patterned mask layer is then removed, followed by formation of a second patterned mask layer (e.g., a second patterned photoresist mask) on the polysilicon layer. Dopant ions of the second conductivity type are subsequently implanted into the polysilicon layer using the second patterned mask layer as an implantation mask. The second patterned mask layer is then removed, followed by formation of a third patterned mask layer on the polysilicon layer. Next, the polysilicon layer is etched using the third patterned mask layer as an etch mask to form a patterned polysilicon layer with a first polysilicon portion of the first conductivity type and a second polysilicon portion of the second conductivity type. The semiconductor material substrate and the patterned polysilicon layer are then subjected to a thermal treatment such that dopant ions of the first conductivity type are diffused from the first polysilicon portion into the base region, while dopant ions of the second conductivity type are diffused from the second polysilicon portion into the base region. The dopant ions of the first conductivity type that diffuse into the base region create an extrinsic base region, while the dopant ions of the second conductivity type that diffuse into the collector region create an emitter region that is spaced apart from the extrinsic base region.

Processes according to the present invention are inexpensive since they employ only a single patterned polysilicon layer. In addition, the processes use only standard semiconductor device manufacturing techniques.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which.

DETAILED DESCRIPTION OF THE INVENTION

To be consistent throughout the present specification and for a clear understanding of the present invention, the following definitions are hereby provided for the terms used therein:

The terms "dopant" and "dopants" refer to donor and acceptor impurity atoms (e.g., boron (B), phosphorous (P), arsenic (As), and indium [In]), which are intentionally introduced into a semiconductor substrate (e.g., a silicon wafer) in order to change the substrate's charge-carrier concentration. See, R. S. Muller and T. I. Kamins, *Device Electronics for Integrated Circuits 2nd Edition*, 11–14 (John Wiley and Sons, 1986) for a further description of dopants.

Figure 1:
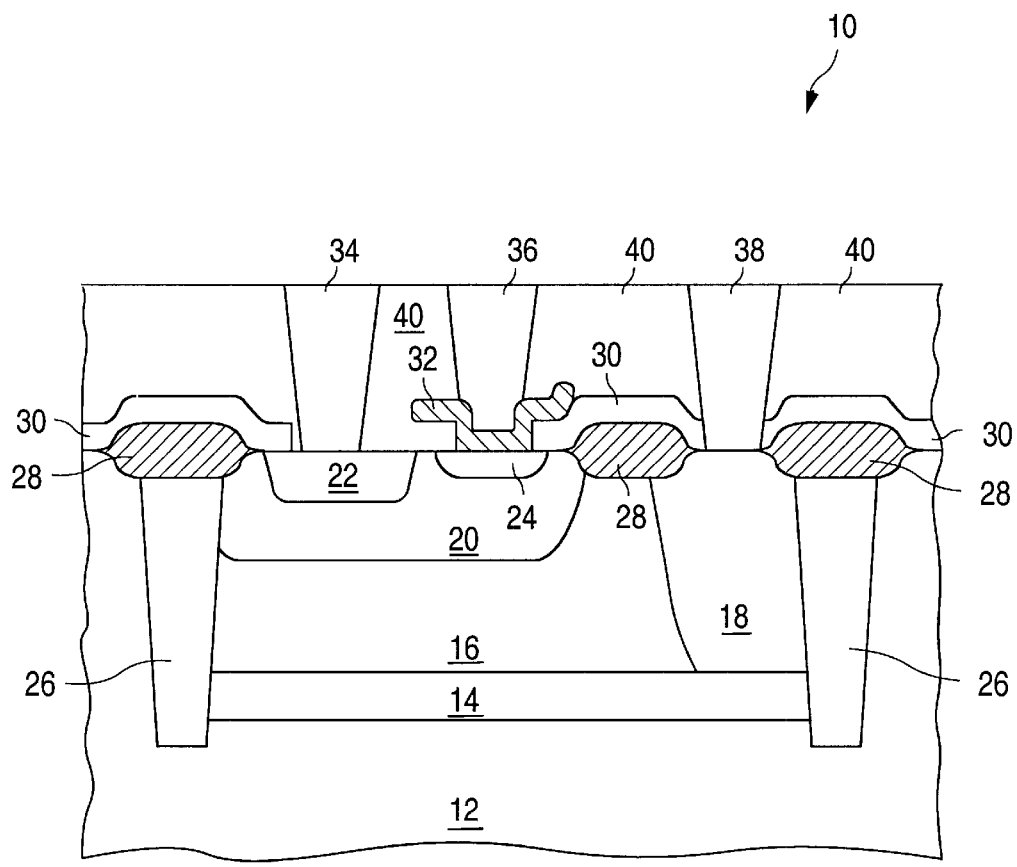
FIG. 1 is a cross-sectional view of a conventional single polysilicon bipolar transistor structure.
Figure 2:
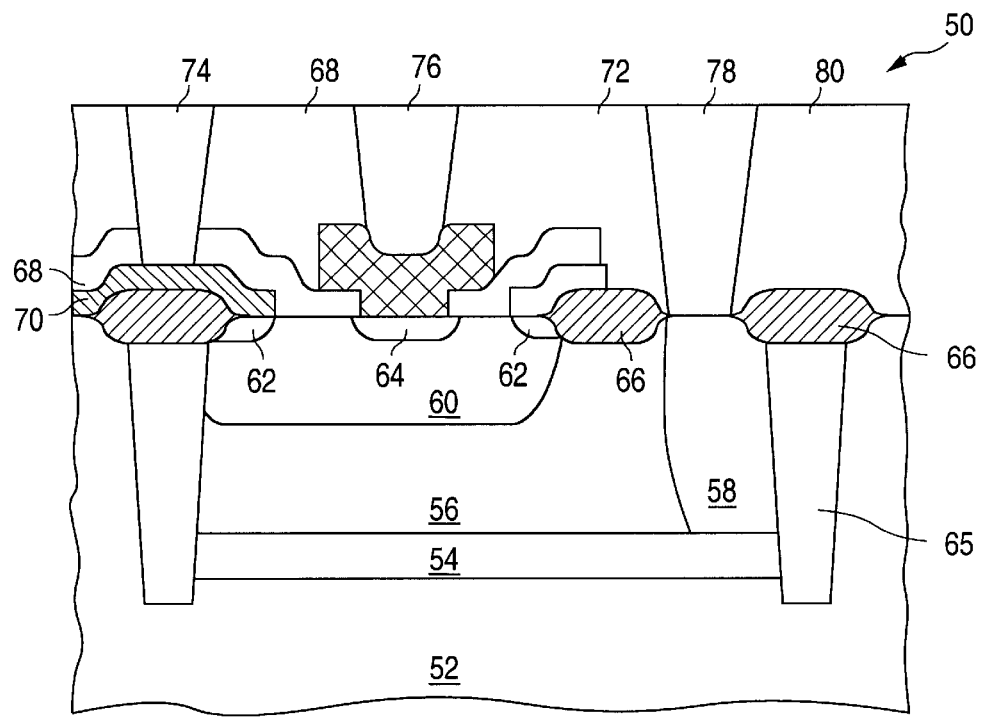
FIG. 2 is a cross-sectional view of a conventional double polysilicon bipolar transistor structure.
Figure 3:
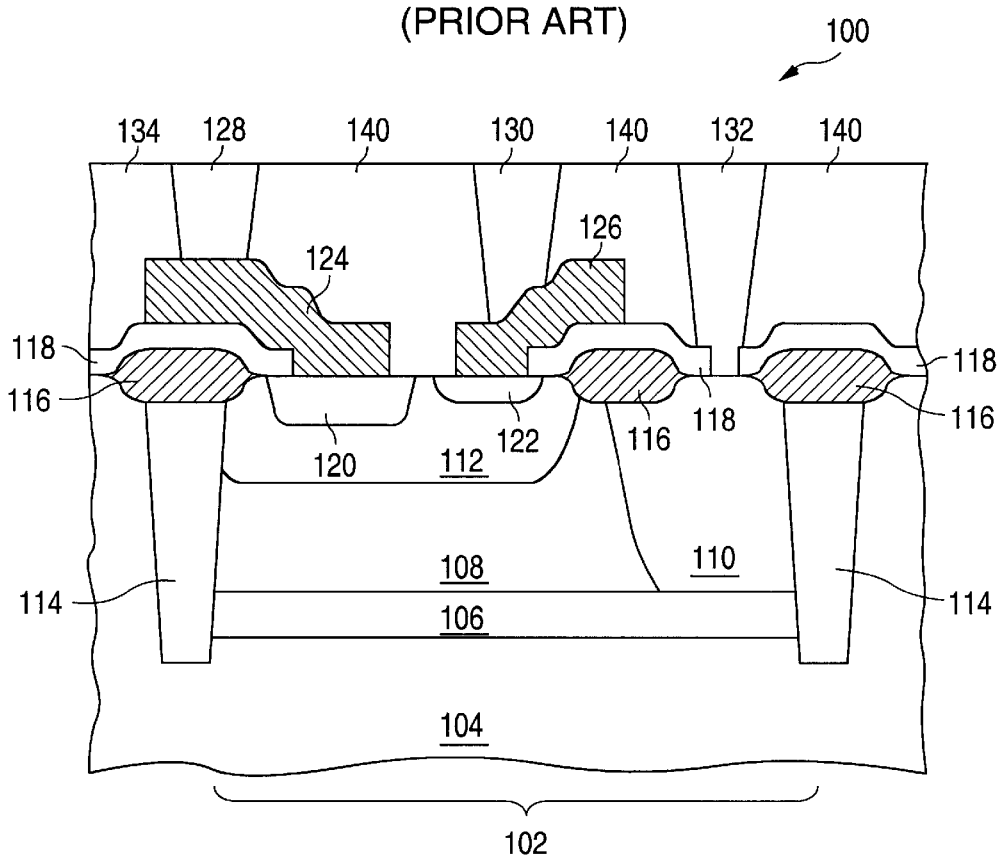
FIG. 3 is a cross-sectional view of a bipolar transistor structure according to the present invention.

FIG. 3 illustrates, in cross-section, a bipolar transistor structure 100 according to the present invention. Bipolar transistor structure 100 includes a semiconductor material substrate 102 (e.g., a silicon substrate). The semiconductor material substrate 102 includes a P-type bottom substrate 104, an N-type buried layer 106, an N-type collector region 108, an N-type sink region 110 and a P-type base region 112. The dimensions of the N-type buried layer 106, N-type collector region 108, N-type sink region 110 and P-type base region 112 are dependent on the process technology used to manufacture the semiconductor material substrate 102 and the capability of the equipment used during manufacture. Exemplary dimensional ranges for a typical 0.5 micron process technology are, however, 3 to 6 microns for the N-type buried layer width, 3 microns to 2 microns for the N-type collector region width, 1 to 2 microns for the P-type base region width and 1 to 2 microns for the N-type sink region width.

The dopant concentrations in the N-type buried layer 106, N-type collector region 108, N-type sink region 110 and P-type base region 112 are dependent on the process technology employed to manufacture the semiconductor material substrate 102 and the desired performance of a bipolar transistor device that includes the bipolar transistor structure 100. For a 0.5 micron technology, however, typical dopant concentrations are, for example, 1E18 atoms per $cm^3$ in the N-type buried layer, 1E15 atoms per $cm^3$ in the N-type collector region, 1E19 atoms per $cm^3$ in the N-type sink region and 1E18 atoms per $cm^3$ in the P-type base region.

The bipolar transistor structure 100 illustrated in FIG. 3 also includes electrical isolation regions. These electrical isolation regions include a trench isolation region 114 and a field silicon dioxide regions 116. The dimensions of the trench isolation region and field silicon dioxide regions are dependent on the process technology used to manufacture the bipolar transistor structure and the voltages used during its operation. However, typical dimensions for a trench isolation region are a width of approximately 1 micron and a depth in the range of 5 microns to 12 microns, while the typical thickness of the field silicon dioxide regions is 0.5 microns.

One skilled in the art will recognize that any suitable electrical isolation region can be substituted for the trench isolation region 114 and field silicon dioxide regions 116 shown in FIG. 3. For example, a silicon dioxide ($SiO_2$) isolation region formed using LOcal Oxidation of Silicon (LOCOS) techniques or any other known electrical isolation structures, including junction isolation structures, can be substituted.

FIG. 3 depicts an embodiment of the present invention that includes an optional patterned silicon dioxide ($SiO_2$) layer 118. The function of such an optional patterned silicon dioxide layer is described in conjunction with processes according to the present invention below.

Semiconductor material substrate 102 also includes a P-type extrinsic base region 120 (that extends from the upper surface of the semiconductor material substrate 102 into the P-type base region 112) and an N-type emitter region 122 (that also extends from the upper surface of the semiconductor material substrate 102 into the P-type base region 112). The N-type emitter region 122 is spaced apart from the P-type extrinsic base region 120.

The bipolar transistor structure 100 further includes a single patterned polysilicon layer partially overlying the semiconductor material substrate 102 and partially overlying the patterned silicon dioxide layer 118. The single patterned polysilicon layer has a first polysilicon portion 124 of P-type conductivity in contact with the P-type extrinsic base region 120, as well as a second polysilicon portion 126 of N-type conductivity in contact with the N-type emitter region 122. Bipolar transistor structure 100 also includes a base contact 128 in contact with the first polysilicon portion 124, an emitter contact 130 in contact with the second polysilicon portion 126, and a collector contact 132 in contact with the N-type sink region 110. Each of these contacts extend through planarized dielectric layer 134.

Bipolar transistor structures according to the present invention are relatively compact since their base contact need only be in direct contact with the first polysilicon portion, and not the extrinsic base region. This permits the extrinsic base region and base region to be of a relatively small size compared to conventional single polysilicon bipolar transistor structures.

Bipolar transistor structures according to the present invention, such as bipolar transistor structure 100, also have a low extrinsic base region resistance ($R_{B1}$), a low base region resistance ($R_{B2}$) and a low collector-base capacitance ($C_{CB}$). The extrinsic base region resistance, base region resistance and collector-base capacitance are low due to the relatively small dimensions of the extrinsic base region and base region, in comparison to conventional single polysilicon bipolar transistor structures.

Furthermore, the performance (e.g., speed) of bipolar transistor devices that include bipolar transistor structures according to the present invention is improved by the aforementioned low extrinsic base region resistance, low base region resistance and low collector-base capacitance. It is envisioned that the extrinsic base region and base region resistances and the collector-base capacitance will be improved by at least 20 to 40% compared to bipolar transistor devices that include conventional single polysilicon bipolar transistor structures.

Although FIG. 3 depicts a bipolar transistor structure 100 with an NPN configuration, one skilled in the art will recognize that bipolar transistor structures according to the present invention can also have a PNP configuration.

Figure 4:
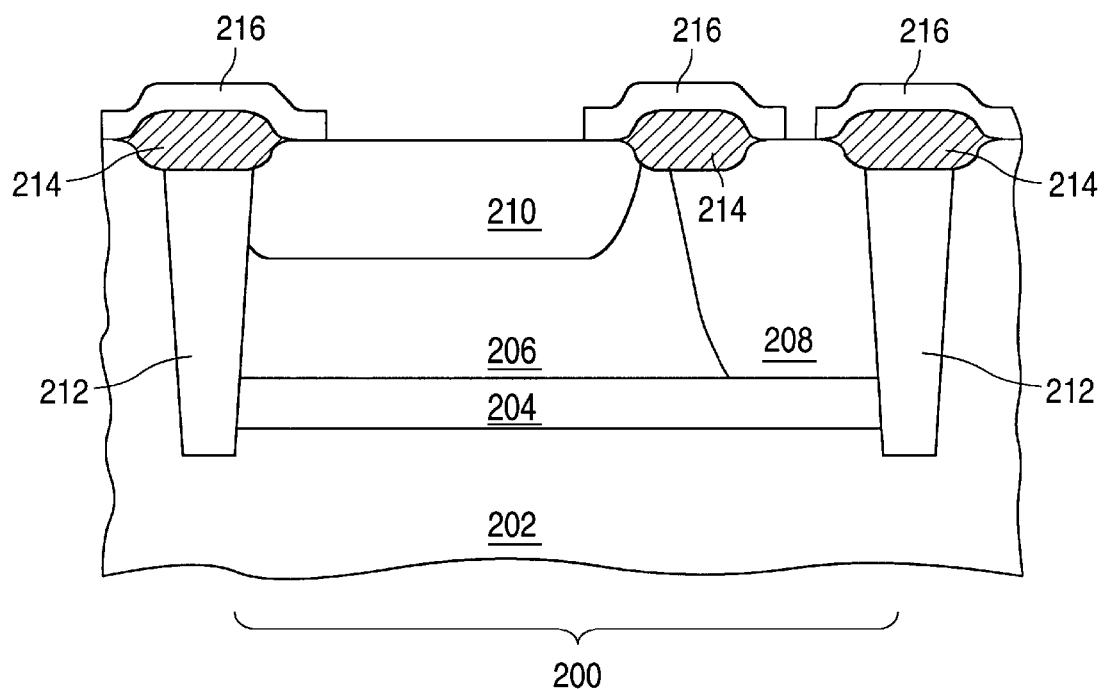
FIGS. 4–11 are cross-sectional views illustrating stages in a process for forming a bipolar transistor structure in accordance with the present invention.

Also provided by the present invention is a method for forming a bipolar transistor structure that is inexpensive and compatible with standard semiconductor device manufacturing techniques. A semiconductor material substrate 200 is first provided that includes a P-type bottom substrate 202 (e.g., a P-type silicon wafer), an N-type buried layer 204 that overlies the P-type bottom substrate 202, and an N-type collector region 206 that overlies the N-type buried layer 204, as illustrated in FIG. 4. The semiconductor material substrate 200 also includes an N-type sink region 208 that extends from the upper surface of the semiconductor material substrate 200 to the N-type buried layer 204 (the N-type sink region 208 also being adjacent to the N-type collector region 206) and a P-type base region 210 disposed over the N-type collector region 206 and spaced apart from the N-type sink region 208.

The dopant concentration in each of the N-type buried layer 204, N-type collector region 206, N-type sink region 208 and P-type base region 210 is dependent on the technology used to create the semiconductor material substrate 200. However, exemplary dopant concentrations are 1E18 atoms per $cm^3$ for the N-type buried layer, 1E15 atoms per $cm^3$ for the N-type collector region, 1E19 atoms per $cm^3$ for the N-type sink region and 1E18 atoms per $cm^3$ for the P-type base region.

The N-type buried layer 204 can be formed using conventional techniques, such as ion implantation into an appropriate semiconductor substrate. The N-type collector region 206, N-type sink region 208 and P-type base region 204 can then be formed by depositing an epitaxial silicon layer on the N-type buried layer 204, followed by ion implantation. The implantation doses and energies employed to create the N-type buried layer 204, the N-type collector region 206, the N-type sink region 208 and the P-type base region are dependent on the desired performance and operational characteristics of a bipolar transistor device that will employ the bipolar transistor structure. However, representative doses and energies are approximately as follows: for an N-type buried layer, a dose of 1E15 ions per $cm^2$ at an implantation energy of 70 KeV to 90 KeV; for an N-type collector region, a dose of 1E12 ions per $cm^2$ at an implantation energy of 300 KeV; for an N-type sink region, a dose of 1E15 ions per $cm^2$ at an implantation energy of 150 KeV; and for a P-type base region, a dose of 1E13 ions per $cm^2$ at an implantation energy of 40 KeV.

FIGS. 4 depicts a semiconductor material substrate that has had electrical isolation regions formed in and on its surface. The electrical isolation regions include a trench isolation region 212 and field silicon dioxide ($SiO_2$) regions 214. Also depicted in FIG. 4, although optional, is a patterned silicon dioxide ($SiO_2$) layer 216. Patterned silicon dioxide layer 216 is optionally provided such that a subsequent thermal treatment step creates an N-type emitter region that is spaced away from the high stress bird's beak region of a field silicon dioxide region 214 disposed between the P-type base region 210 and the N-type sink region 208.

One skilled in the art will recognize that any known type of electrical isolation region can be alternatively provided in and on the semiconductor material substrate, such as a trench isolation region, a silicon dioxide ($SiO_2$) isolation region formed using LOcal Oxidation of Silicon (LOCOS) techniques or any other known electrical isolation structures, including junction isolation structures.

Figure 5:
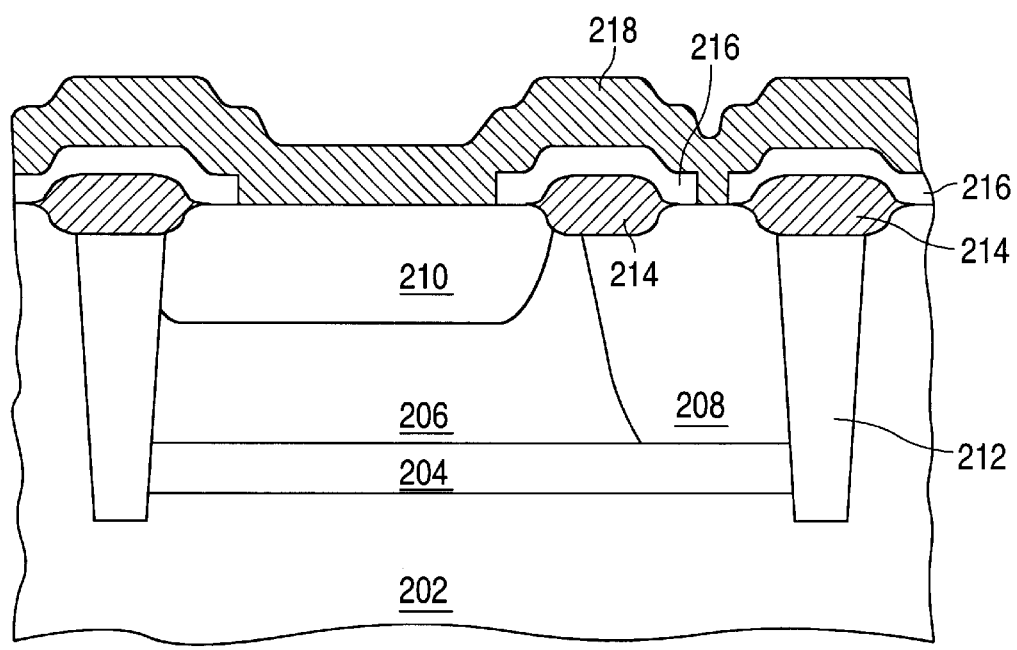

Next, a polysilicon layer 218 is deposited overlying the semiconductor material substrate 200, the field silicon dioxide regions 214 and the patterned silicon dioxide layer 216. The resultant structure is illustrated in FIG. 5. The polysilicon layer 218 can be deposited using conventional semiconductor device manufacturing techniques, such as a low pressure chemical vapor deposition (LPCVD) technique, and has a thickness, for example, of 0.4 microns.

Figure 6:
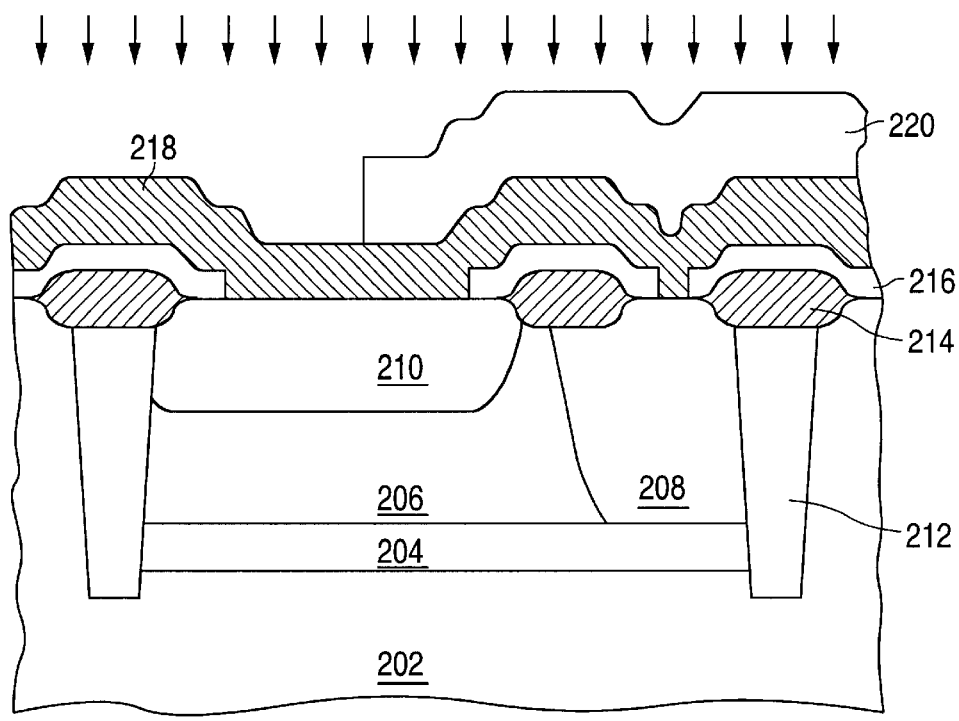

Next, a first patterned mask layer 220 is formed on the polysilicon layer 218, as illustrated in FIG. 6. The first patterned mask later can be formed using conventional photolithographic techniques that are well known in the field.

Next, P-type dopant ions (e.g., boron ions at a dose of 1E16 ions per cm² and an implantation energy of 25–30 KeV) are implanted into the polysilicon layer 218 using the first patterned mask layer 220 as an implantation mask. The direction of dopant ion implantation is represented by arrows in FIG. 6. The first patterned mask layer 220 is subsequently removed using conventional ashing and stripping techniques.

Figure 7:
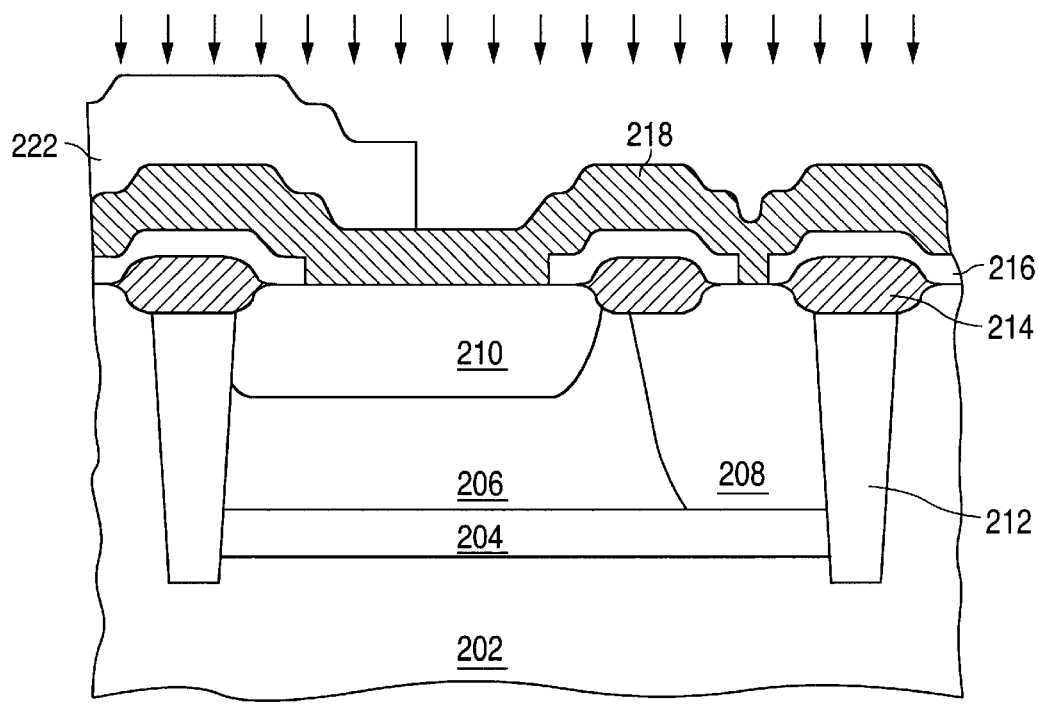

Next, a second patterned mask layer 222 is formed on the polysilicon layer 218, as illustrated in FIG. 7. The second patterned mask layer 222 can be formed using conventional photolithographic techniques that are well known in the field. N-type dopant ions (e.g., arsenic ions at a dose of approximately 1E16 ions per cm² and an implantation energy of 30–40 KeV) are then implanted into the polysilicon layer 218 using the second patterned mask layer 222 as an implantation mask. The dopant ion implantation direction is represented by arrows in FIG. 7. The second patterned mask layer 222 is subsequently removed using conventional ashing and stripping techniques.

One skilled in the art will recognize that the sequence of masking and implantation steps can be reversed such that the N-type dopant ions are implanted first, followed by-the implantation of the P-type dopant atoms.

Figure 8:
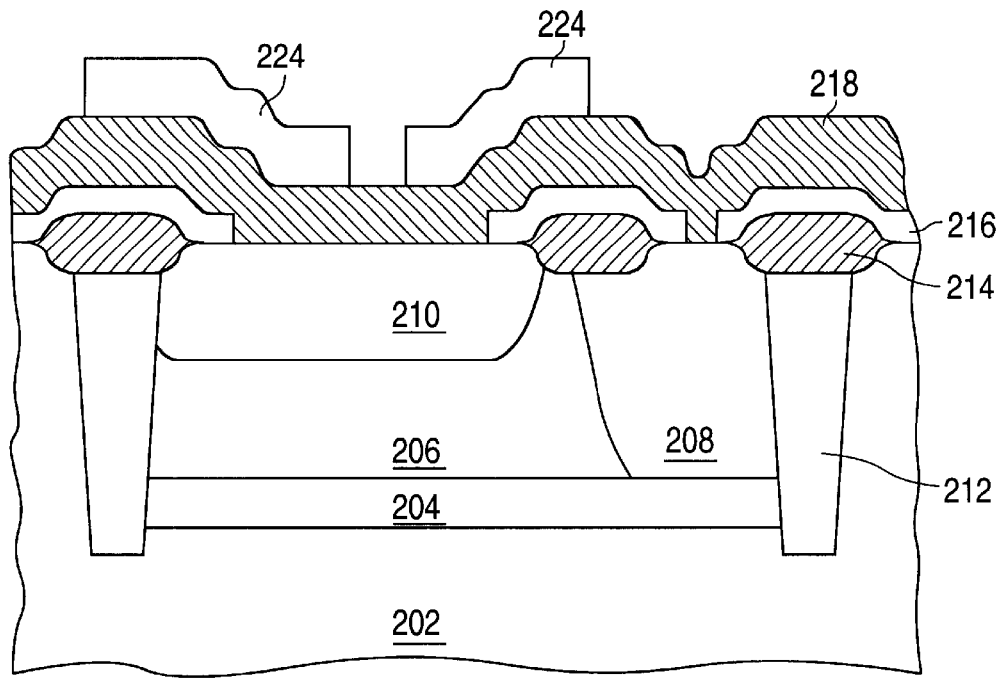

Next, a third patterned mask layer 224 is formed on the polysilicon layer 218. The third patterned mask layer 224 can be formed using conventional photolithographic techniques that are well known in the field. The resultant structure is shown in FIG. 8.

Next, the polysilicon layer 218 is etched using the third patterned mask layer 224 as an etch mask to form a patterned polysilicon layer with a first polysilicon portion 226 that is P-type and a second polysilicon portion 228 that is N-type type. The third patterned mask layer 224 is subsequently removed using conventional ashing and stripping techniques. The resultant structure is illustrated in FIG. 9.

Figure 9:
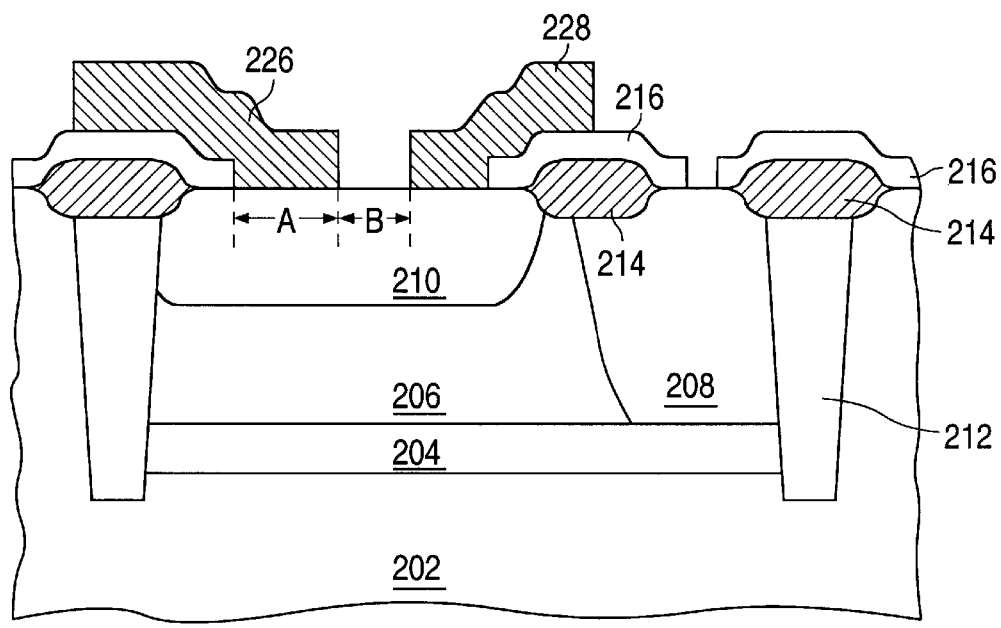

It should be noted that dimension A (i.e., the dimension by which the first polysilicon portion 226 overlies the P-type base region 210) and dimension B (i.e., the spacing between the first polysilicon portion 226 and the second polysilicon portion 228) of FIG. 9 can each be as small as permitted by the capability of the photolithography equipment. For example, for a 0.5 micron technology, dimensions A and B can be 0.5 microns each.

Figure 10:
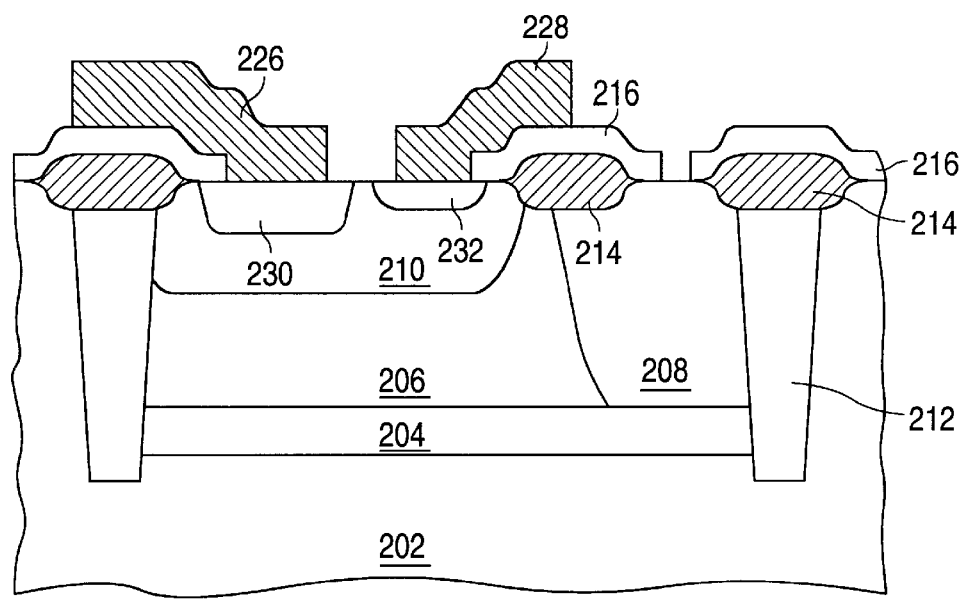

Next, the semiconductor material substrate 200 and the patterned polysilicon layer are subjected to a thermal treatment such that dopant ions of the first conductivity type are diffused from the first polysilicon portion 226 into the P-type base region 210, thereby creating an extrinsic base region 230 of the first conductivity type and such that dopant ions of the second conductivity type are diffused from the second polysilicon portion 228 into the P-type base region 210, thereby creating an emitter region 232 of the second conductivity type. The resultant structure is shown in FIG. 10. The thermal treatment is predetermined such that the resultant emitter region 232 is spaced apart from the extrinsic base region 230. The thermal treatment can be conducted, for example, at a temperature in the range of 1000° C. to 1100° C. for a time period of 20 seconds to 60 seconds.

Figure 11:
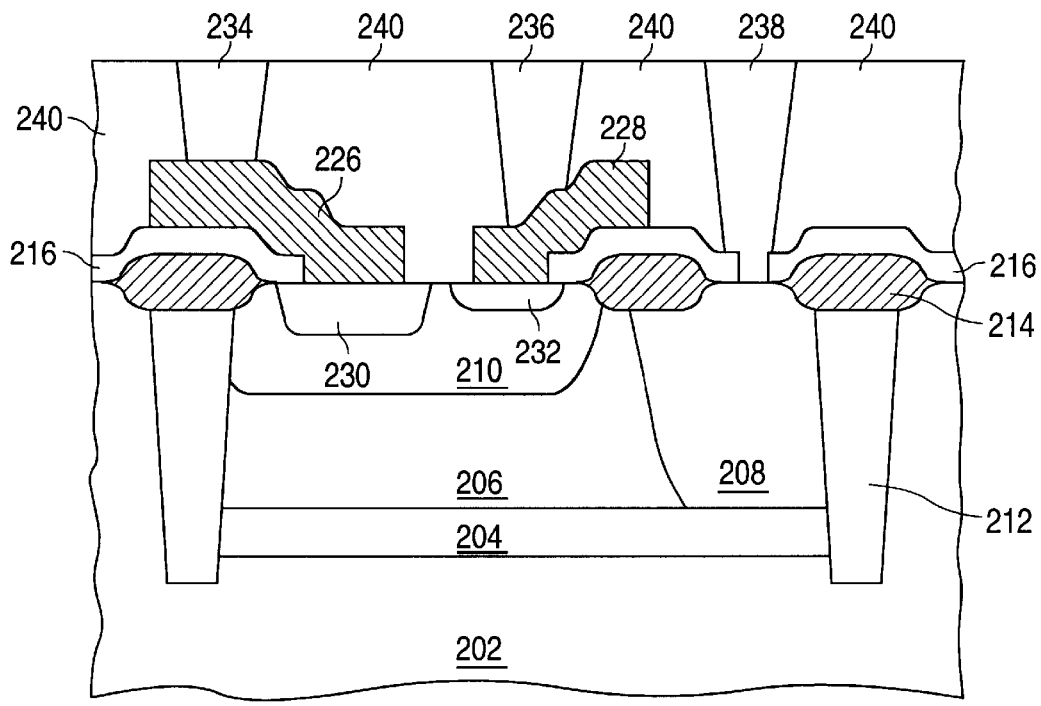

Next, a base contact 234, emitter contact 236 and collector contact 238 are formed through a planarized dielectric layer 240. The resultant structure is illustrated in FIG. 11. These contacts and planarized dielectric layer 240 can be formed using standard semiconductor device manufacturing techniques that are well known in the art. In FIG. 11, the first polysilicon portion 226 is considered to have a first sub-portion overlying the extrinsic base region 230 and second sub-portion spaced apart from the extrinsic base region 230 and overlying the patterned silicon dioxide layer 216, the field silicon dioxide region 214 and the trench isolation region 212. The base contact 234 in the embodiment of FIG. 11 is in contact with the second sub-portion.

As illustrated by FIG. 11, processes according to the present invention provide for a base contact to contact a first polysilicon portion at a location that is not directly above a base region (e.g., over an electrical isolation region or other remote location). This enables the bipolar transistor structures formed using processes in accordance with the present invention to be compact. The bipolar transistor structures formed using the present processes are also compact since dimensions A and B (see FIG. 9) can be made as small as possible given the capabilities of standard photolithographic equipment. Processes according to the present invention are inexpensive since only one polysilicon deposition step and one polysilicon etch step are required.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method for forming a bipolar transistor structure, the method comprising the steps of:

providing a semiconductor material substrate having:
      a bottom substrate of a first conductivity type;
      a buried layer of a second conductivity type overlying the bottom substrate;
      a collector region of the second conductivity type overlying the buried layer;
      a sink region of the second conductivity type extending from the upper surface of the semiconductor material substrate to the buried layer, the sink region being adjacent to the collector region; and
      a base region of the first conductivity type overlying the collector region and spaced apart from the sink region;

depositing a polysilicon layer overlying the upper surface of the semiconductor material substrate;

forming a first patterned mask layer on the polysilicon layer;

implanting dopant ions of the first conductivity type into the polysilicon layer using the first patterned mask layer as an implantation mask;

removing the first patterned mask layer;

forming a second patterned mask layer on the polysilicon layer;

implanting dopant ions of the second conductivity type into the polysilicon layer using the second patterned mask layer as an implantation mask;

removing the second patterned mask layer;

forming a third patterned mask layer on the polysilicon layer;

etching the polysilicon layer using the third patterned mask layer as an etch mask to form a patterned polysilicon layer with a first polysilicon portion of the first conductivity type and a second polysilicon portion of the second conductivity type; and subjecting the semiconductor material substrate and the patterned polysilicon layer to a thermal treatment such that dopant ions of the first conductivity type are diffused from the first polysilicon portion into the base region, thereby creating an extrinsic base region of the first conductivity type and such that dopant ions of the second conductivity type are diffused from the second polysilicon portion into the base region, thereby creating an emitter region of the second conductivity type, the emitter region being spaced apart from the extrinsic base region.

2. The method of claim 1, wherein the providing step includes providing a semiconductor material substrate with at least one electrical isolation region.

3. The method of claim 1, wherein the subjecting step includes subjecting the semiconductor material substrate and the patterned polysilicon layer to a thermal treatment at a temperature in the range of 1000° C. to 1100° C. for a time period in the range of 20 seconds to 60 seconds.

4. The method of claim 1, wherein the step of implanting dopant ions of a second conductivity type includes implanting boron ions and the step of implanting dopant ions of a second conductivity type includes implanting arsenic ions.

5. The method of claim 1, further comprising, after the subjecting step, the step of forming a base contact, an emitter contact and a collector contact, the base contact being in contact with the first polysilicon portion, the emitter contact being in contact with the second polysilicon portion and the collector contact being in contact with the sink region.

6. The method of claim 1, wherein the step of etching the polysilicon layer forms a patterned polysilicon layer with a first polysilicon portion and a second polysilicon portion overly the base region, the first polysilicon portion and second polysilicon portion being spaced apart over the base region by no more than 0.5 microns.

* * * * *